(12) United States Patent
Chui et al.

(10) Patent No.: US 10,707,334 B2
(45) Date of Patent: Jul. 7, 2020

(54) REDUCTION OF FIN LOSS IN THE FORMATION OF FINFETS

(71) Applicant: Taiwan Semiconductor Manufacturing Company, Ltd., Hsinchu (TW)

(72) Inventors: Chi On Chui, Hsinchu (TW); Yee-Chia Yeo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/390,528

(22) Filed: Apr. 22, 2019

(65) Prior Publication Data

US 2019/0245067 A1 Aug. 8, 2019

Related U.S. Application Data

(63) Continuation of application No. 15/696,981, filed on Sep. 6, 2017, now Pat. No. 10,269,939, which is a continuation of application No. 15/257,568, filed on Sep. 6, 2016, now Pat. No. 9,768,278.

(51) Int. Cl.
*H01L 29/66* (2006.01)
*H01L 21/265* (2006.01)
*H01L 21/324* (2006.01)

(52) U.S. Cl.
CPC .... *H01L 29/66803* (2013.01); *H01L 21/2652* (2013.01); *H01L 21/324* (2013.01); *H01L 29/66545* (2013.01); *H01L 29/66636* (2013.01)

(58) Field of Classification Search
CPC ...... H01L 29/66; H01L 21/265; H01L 21/324
See application file for complete search history.

(56) References Cited

U.S. PATENT DOCUMENTS

| 2011/0101455 A1* | 5/2011 | Basker ............. H01L 21/26586 257/347 |
| 2012/0018730 A1 | 1/2012 | KJanakasabapathy et al. |
| 2013/0102119 A1* | 4/2013 | Cheng ............. H01L 29/66477 438/283 |

(Continued)

FOREIGN PATENT DOCUMENTS

| KR | 20110049709 A | 5/2011 |
| WO | 2015112367 A1 | 7/2015 |

OTHER PUBLICATIONS

Tsai et al., "Recrystallization of implanted amorphous silicon layers. I. Electrical properties of silicon implanted with BF+ 2 or Si++B+ a)", Journal of Applied Physics, vol. 50(1), Jan. 1979, 6 pages.

*Primary Examiner* — Tuan N Nguyen
(74) *Attorney, Agent, or Firm* — Slater Matsil, LLP

(57) ABSTRACT

A method includes forming a dummy gate stack on a top surface and a sidewall of a middle portion of a semiconductor fin, and forming a spacer layer. The spacer layer includes a first portion on a sidewall of the dummy gate stack, and a second portion on a top surface and a sidewall of a portion of the semiconductor fin. The method further includes performing an implantation on the spacer layer. After the implantation, an anneal is performed. After the anneal, the second portion of the spacer layer is etched, wherein the first portion of the spacer layer remains after the etching. A source/drain region is formed on a side of the semiconductor fin.

20 Claims, 14 Drawing Sheets

(56) References Cited

U.S. PATENT DOCUMENTS

| | | | |
|---|---|---|---|
| 2013/0270628 A1* | 10/2013 | Huang | H01L 29/0847 257/329 |
| 2014/0151762 A1 | 6/2014 | Wang et al. | |
| 2014/0264572 A1* | 9/2014 | Kim | H01L 21/3083 257/331 |
| 2015/0108430 A1* | 4/2015 | Cheng | H01L 29/66795 257/20 |
| 2015/0270342 A1 | 9/2015 | Tsai et al. | |

* cited by examiner

US 10,707,334 B2

REDUCTION OF FIN LOSS IN THE FORMATION OF FINFETS

PRIORITY CLAIM AND CROSS-REFERENCE

This application is a continuation of U.S. patent application Ser. No. 15/696,981, entitled "Reduction of Fin Loss in the Formation of FinFETs," filed on Sep. 6, 2017, which is a continuation of U.S. patent application Ser. No. 15/257,568, entitled "Reduction of Fin Loss in the Formation of FinFETs," filed on Sep. 6, 2016, now U.S. Pat. No. 9,768,278 issued Sep. 19, 2017, which applications are incorporated herein by reference.

BACKGROUND

Technological advances in IC materials and design have produced generations of ICs where each generation has smaller and more complex circuits than the previous generation. In the course of IC evolution, functional density (i.e., the number of interconnected devices per unit chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, three-dimensional transistors such as a Fin Field-Effect Transistors (FinFETs) have been introduced to replace planar transistors. Although existing FinFET devices and methods of fabricating FinFET devices have been generally adequate for their intended purposes, they have not been entirely satisfactory in all respects. Improvements in this area are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
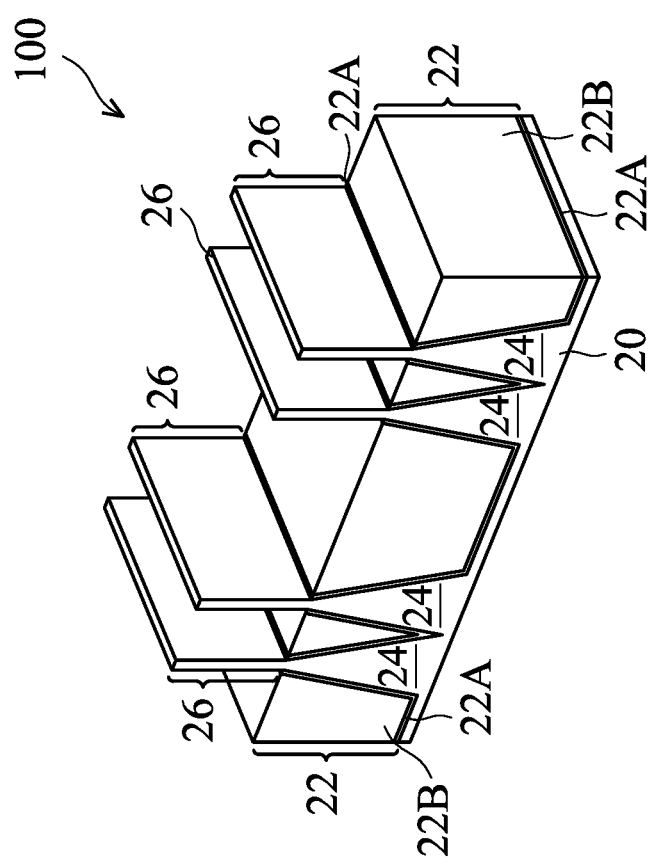
FIGS. 1 through 11 are cross-sectional views and perspective views of intermediate stages in the formation of a Fin Field-Effect Transistor (FinFET) in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements.

FIGS. 1 through 11 illustrate the perspective views and cross-sectional views of intermediate stages in the formation of a FinFET in accordance with some embodiments of the present disclosure. The steps shown in FIG. 1 through 11 are also reflected schematically in the process flow 200 shown in FIG. 12.

FIG. 1 illustrates a perspective view of substrate 20, which may be a part of wafer 100. Substrate 20 may be a semiconductor substrate, such as a silicon substrate, a silicon carbon substrate, a silicon-on-insulator substrate, a III-V compound semiconductor substrate, or a substrate formed of other semiconductor materials. Substrate 20 may be lightly doped with a p-type or an n-type impurity.

Isolation regions 22, which are alternatively referred to as Shallow Trench Isolation (STI) regions, are formed to extend into semiconductor substrate 20. The respective step is shown as step 202 in the process flow shown in FIG. 12. The formation of STI regions may include etching substrate 20 to form trenches (shown as filled by STI regions 22), and filling the trenches with a dielectric layer(s). A planarization such as a Chemical Mechanical Polish (CMP) is performed to level the top surface of the dielectric material with the top surface of the respective hard mask (not shown) used for defining the patterns of STI regions 22. The hard mask is then removed, followed by recessing STI regions 22, and the resulting structure is shown in FIG. 1.

In accordance with some embodiments of the present disclosure, STI regions 22 include liner oxide 22A and dielectric material 22B over liner oxide 22A. Liner oxide 22A is formed by oxidizing wafer 100 in an oxygen-containing environment, for example, through Local Oxidation of Silicon (LOCOS), wherein oxygen ($O_2$) may be included in the respective process gas. In accordance with other embodiments of the present disclosure, liner oxide 22A is formed using In-Situ Steam Generation (ISSG), for example, with water steam or a combined gas of hydrogen ($H_2$) and oxygen ($O_2$) used to oxidize semiconductor strips 24 between the trenches. In accordance with yet other embodiments, liner oxide 22A is formed using a deposition method such as Sub Atmospheric Chemical Vapor Deposition (SACVD). Dielectric material 22B is formed over liner oxide 22A. The formation method of dielectric material 22B may be selected from Flowable Chemical Vapor Deposition (FCVD), Chemical Vapor Deposition (CVD), Atomic Layer Deposition (ALD), spin-on coating, and the like.

Throughout the description, the portions of semiconductor substrate 20 between neighboring STI regions 22 are referred to as semiconductor strips 24. Due to the recess of STI regions 22, semiconductor fins 26 are formed to protrude higher than the top surfaces of STI regions 22. In accordance with some embodiments of the present disclosure, semiconductor fins 26 and semiconductor strips 24 are parts of the original semiconductor substrate 20. In accordance with alternative embodiments, semiconductor fins 26 (and possibly some top parts of semiconductor strips 24) are epitaxy regions formed of a semiconductor material different from the material of substrate 20. For example, semiconductor fins 26 may be formed of silicon germanium (SiGe).

Figure 2:
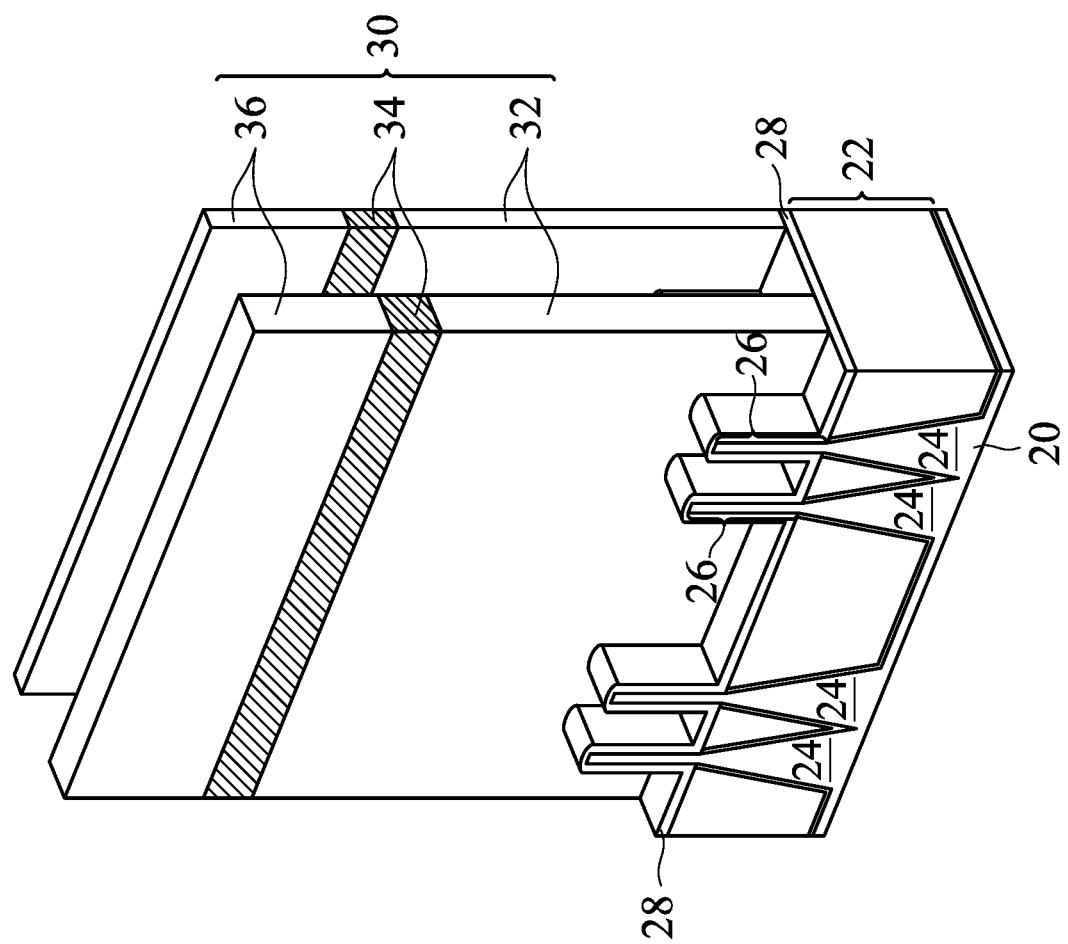

FIG. 2 illustrates the formation of dummy gate dielectric layer 28, which may include silicon oxide or a composite layer including a plurality of dielectric layers, for example. Dummy gate dielectric layer 28 is referred to as dummy gate oxide layer hereinafter. The respective step is shown as step 204 in the process flow shown in FIG. 12. In accordance with some embodiments of the present disclosure, dummy oxide layer 28 is formed through deposition, and hence extends on the top surfaces of STI regions 22. In accordance with alternative embodiments of the present disclosure, dummy oxide layer 28 is formed through oxidizing the surface layers of semiconductor fins 26. Accordingly, dummy oxide layer 28 is formed on the exposed surfaces of semiconductor fins 26, and does not include horizontal portions extending on the top surfaces of STI regions 22.

FIG. 2 further illustrates the formation of dummy gate stack 30 on the middle portions of semiconductor fins 26. The respective step is also shown as step 204 in the process flow shown in FIG. 12. In accordance with some embodiments of the present disclosure, dummy gate stack 30 includes dummy gate electrode 32 and mask layers 34 and/or 36. Dummy gate electrode 32 may be formed of polysilicon in accordance with some embodiments, and other materials may also be used. In accordance with some exemplary embodiments, mask layer 34 is formed of silicon nitride, and mask layer 36 is formed of silicon oxide. Dummy gate stack 30 extends on the top surfaces and the sidewalls of semiconductor fins 26. In accordance with some embodiments of the present disclosure, the formation of dummy gate stack 30 includes forming a blanket gate electrode layer and blanket mask layers, and then patterning the blanket gate electrode layer and the blanket mask layers. The patterning is stopped on the top surfaces of dummy oxide layer 28.

In accordance with some embodiments of the present disclosure, after the patterning of the dummy gate electrode layer, the patterning is stopped, and the portions of dummy oxide layer 28 that are directly underlying the removed parts of the dummy gate electrode layer are exposed. The exposed portions of dummy oxide layer 28 are not removed in accordance with these embodiments. Rather, the exposed portions of dummy oxide layer 28 are removed after the subsequently performed anneal. In accordance with alternative embodiments of the present disclosure, the exposed portions of dummy oxide layer 28 are removed, and the remaining portions of dummy oxide layer 28 become the bottom parts of dummy gate stack 30. When the exposed portions of dummy oxide layer 28 are removed, semiconductor fins 26 are exposed.

Figure 3:
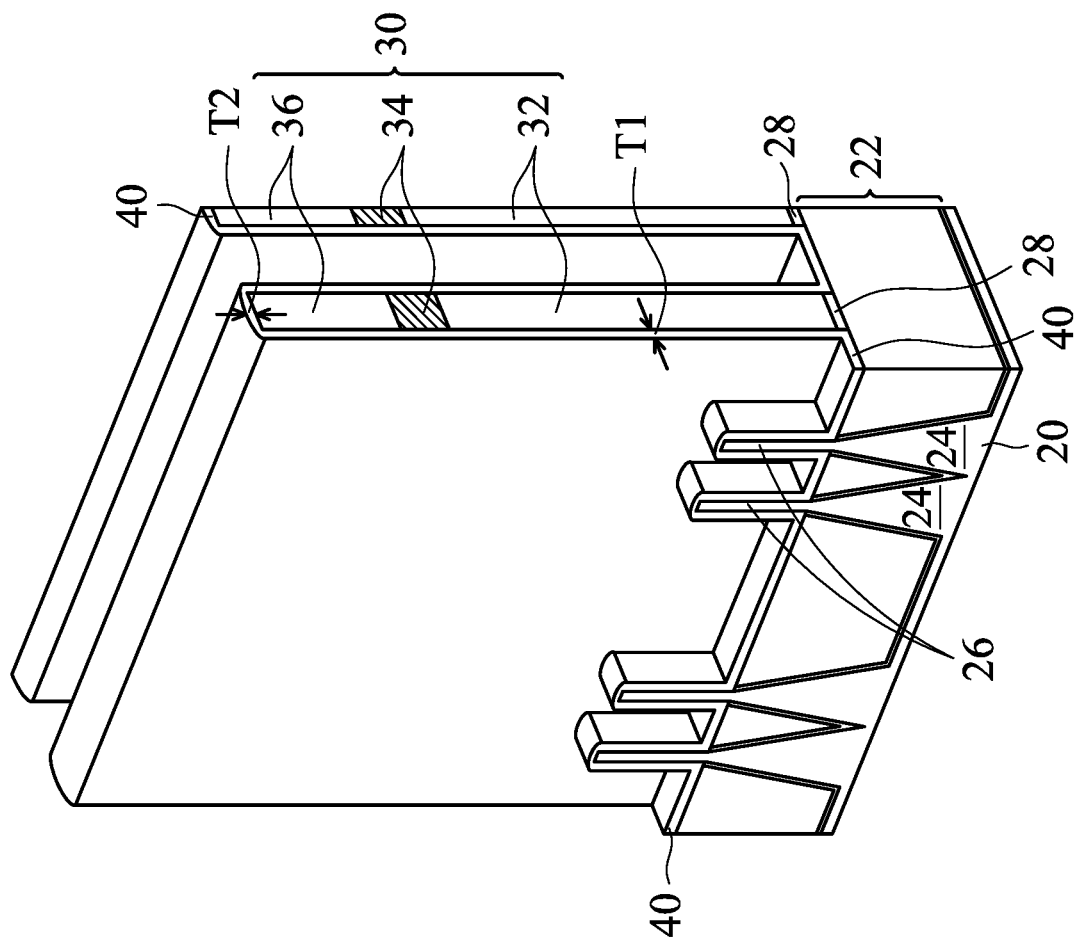

Referring to FIG. 3, gate spacer layer 40 is formed as a blanket layer. Throughout the description, although layer 40 is referred to as a "gate spacer layer," it also extends onto the sidewalls of fins, and hence is also referred to as a "spacer layer." The respective step is shown as step 206 in the process flow shown in FIG. 12. In accordance with some embodiments of the present disclosure, gate spacer layer 40 is formed using a conformal deposition method such as ALD, CVD, etc., so that the sidewall portions of gate spacer layer 40 have an adequate thickness. The horizontal portions and vertical portions of gate spacer layer 40 may have substantially the same thickness, for example, with thickness T1 of the vertical portions and thickness T2 of horizontal portions having a difference smaller than 20 percent of both of thicknesses T1 and T2. In accordance with some exemplary embodiments of the present disclosure, thicknesses T1 and T2 are in the range between about 1 nm and about 20 nm.

The material of gate spacer layer 40 may include silicon oxy-carbonitride (SiOCN), silicon carbo-nitride (SiOC), or a metal oxide such as aluminum oxide. In accordance with some embodiments of the present disclosure, gate spacer layer 40 is formed of SiOCN, and may have a single-layer structure. In accordance with alternative embodiments, gate spacer layer 40 has a composite structure including a plurality of layers. For example, gate spacer layer 40 may include a silicon oxide layer, and a silicon nitride layer over the silicon oxide layer.

Figure 4A:
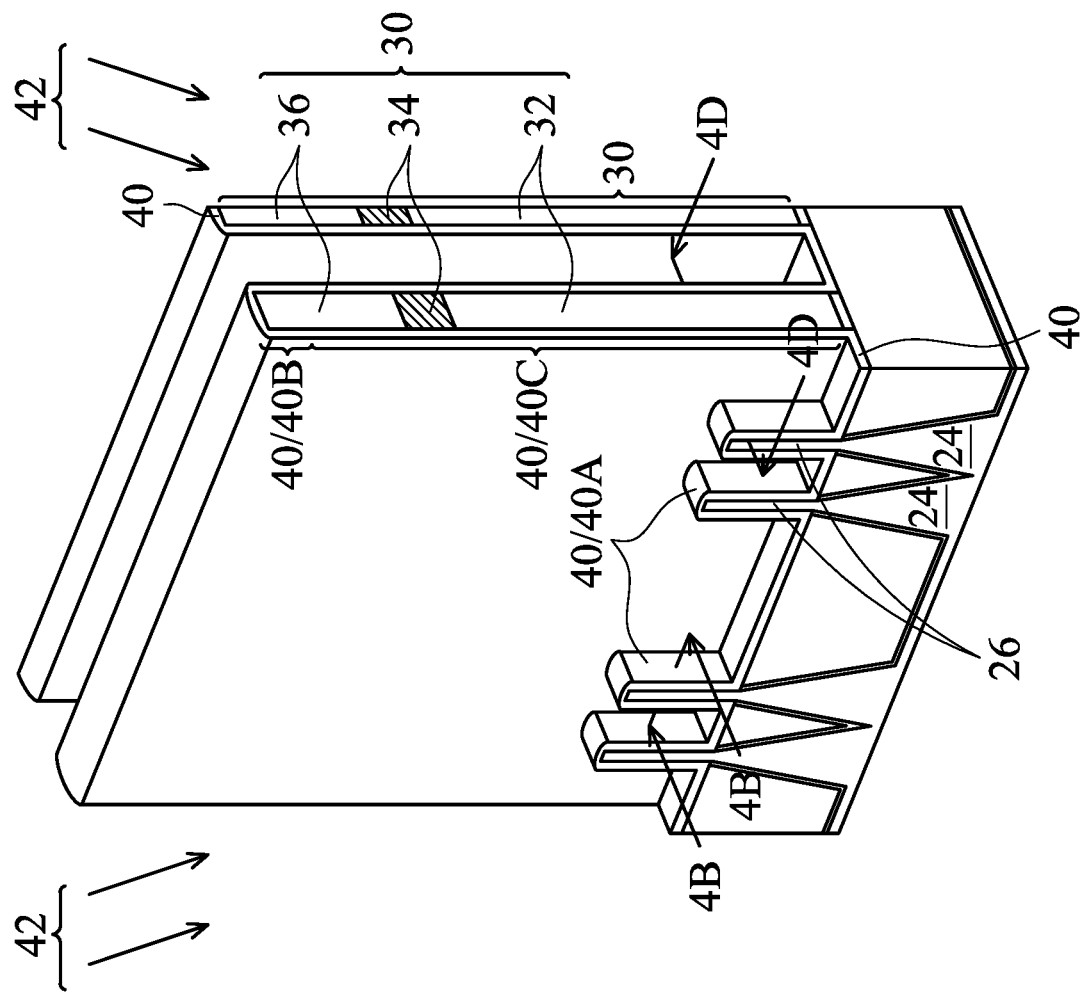

In a subsequent step, as shown in FIG. 4A, an implantation (represented by arrows 42) is performed to implant first portions 40A of gate spacer layer 40 with ionic species (dopants) in order to change the property of the first portions 40A. The respective step is shown as step 208 in the process flow shown in FIG. 12. The first portions 40A of gate spacer layer 40 are the portions on the sidewalls and top surfaces of semiconductor fins 26. The implantation causes the properties of portions 40A to be distinguished from portions 40C of gate spacer layer 40, which are on the sidewalls of dummy gate stack 30. The candidate implanted ionic species/dopants include, and are not limited to, nitrogen (N) ions, boron (B) ions, fluorine (F) ions, and the like.

Figure 4C:
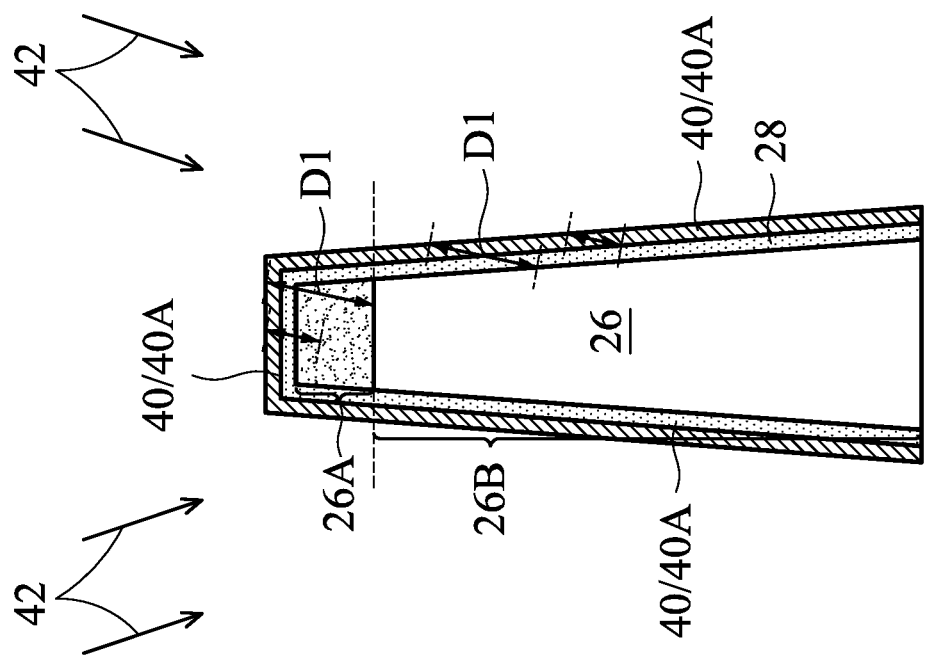
Figure 4B:
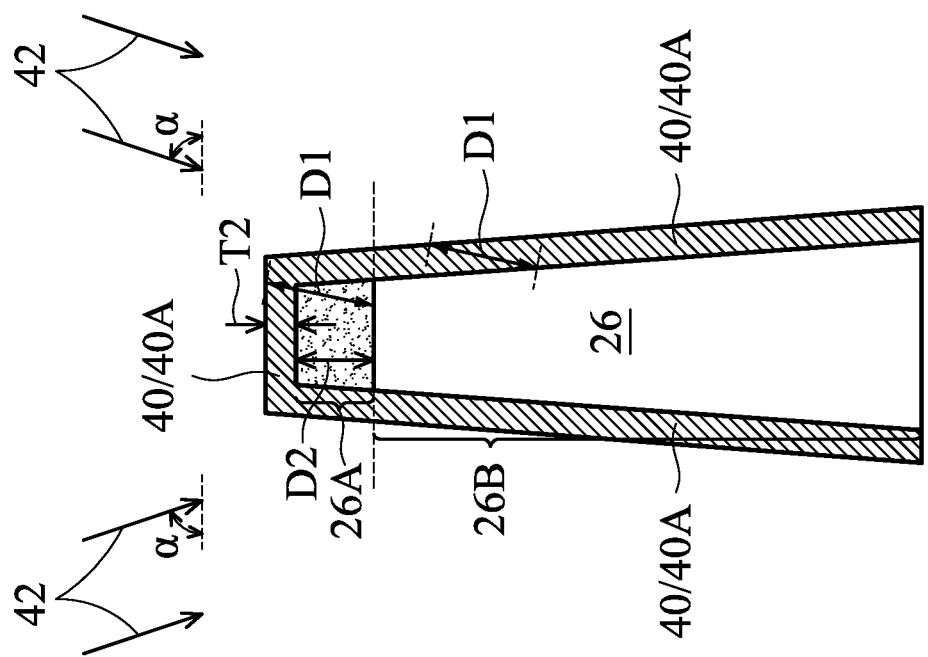

FIG. 4B illustrates a cross-sectional view of the structure shown in FIG. 4A, wherein the cross-sectional view is obtained from the vertical plane containing line 4B-4B in FIG. 4A. In accordance with some embodiments of the present disclosure, the implantation includes two or four tilted implantations tilted in opposite directions. The tilting angle α is selected, so that the implanted species penetrate through, and are spread through, the sidewall portions of gate spacer layer 40, while the amount of the ions implanted into the sidewall portions of semiconductor fins 26 is minimized. Alternatively stated, it is desirable that the sidewall portions of gate spacer layer 40 are implanted without damaging the sidewall portions of semiconductor fins 26. The tilting angle α depends on the implanted element (such as N, B, F, or the like), the implanting energy, and the thickness of gate spacer layer 40. In accordance with some embodiments of the present disclosure, tilting angle α is in the range between about 60 degrees and 90 degrees. The dose of implantation 42 may be greater than about $1E15/cm^2$, and may be in the range between about $1E15/cm^2$ and about $1E18/cm^2$, for example.

It is appreciated that since the ionic species are implanted into the sidewall portions in angles more tilted than implanted into the top portions of gate spacer layer 40 and semiconductor fins 26. Accordingly, when the penetration depth D1 into the sidewall portions of gate spacer layer 40 causes ions to reach, but not penetrating into, semiconductor fins 26, on the top of semiconductor fins 26, the same penetration depth D1 causes the implanted ions to penetrate into the top portions of semiconductor fins 26. This causes the top portions 26A of the originally crystalline semiconductor fins 26 to be implanted by the ions. Top portions 26A of semiconductor fins 26 are thus amorphized (which is alternatively referred to as "damaged" due to the destruction of the lattice structure) to form amorphous semiconductor regions. The lower portions 26B of semiconductor fins 26, on the other hand, are not implanted (or implanted but not significantly enough) by ions, and remain to have a crystalline structure. In accordance with some exemplary embodiments, depth D2 of the resulting amorphous semiconductor regions 26A is greater than about 1 nm, and may be in the range between about 5 nm and about 25 nm in accordance with some embodiments.

In the embodiments shown in FIG. 4B, dummy oxide layer 28 (refer to FIG. 2) have been removed from the portions of semiconductor fins 26 previously, and hence gate spacer layer 40 is in contact with the top surfaces and the sidewalls of semiconductor fins 26. FIG. 4C illustrates a cross-sectional view in accordance with alternative embodiments, wherein the cross-sectional view is also obtained from the vertical plane containing line 4B-4B in FIG. 4A. In accordance with these embodiments, dummy oxide layer 28 is left un-etched, and gate spacer layer 40 is formed over dummy oxide layer 28. In accordance with some embodiments of the present disclosure, the implantation process is adjusted, so that the implanted ions penetrate through gate spacer layer 40, and do not extend into dummy oxide layer 28 significantly. It is appreciated that dummy oxide layer 28 and gate spacer layer 40 are formed of different materials, and may already have adequate difference in response to etching. Accordingly, not implanting dummy oxide layer 28 will not affect the removal of dummy oxide layer 28 in subsequent steps.

In accordance with alternative embodiments, the implantation process is adjusted, so that the implanted ions penetrate through both gate spacer layer 40 and dummy oxide layer 28, and do not extend into semiconductor fins 26 significantly. It is realized that the implanted ions have a certain distribution, and hence there will be a small amount of ions implanted into semiconductor fins 26. However, the amount is small enough and does not cause the amorphization of the sidewall portions of semiconductor fins 26.

In the embodiments shown in FIG. 4C, top portions 26A of semiconductor fins 26 are also amorphized to form amorphous semiconductor regions, while the lower portions 26B of semiconductor fins 26 are not implanted, and remain to be crystalline.

Figure 4D:
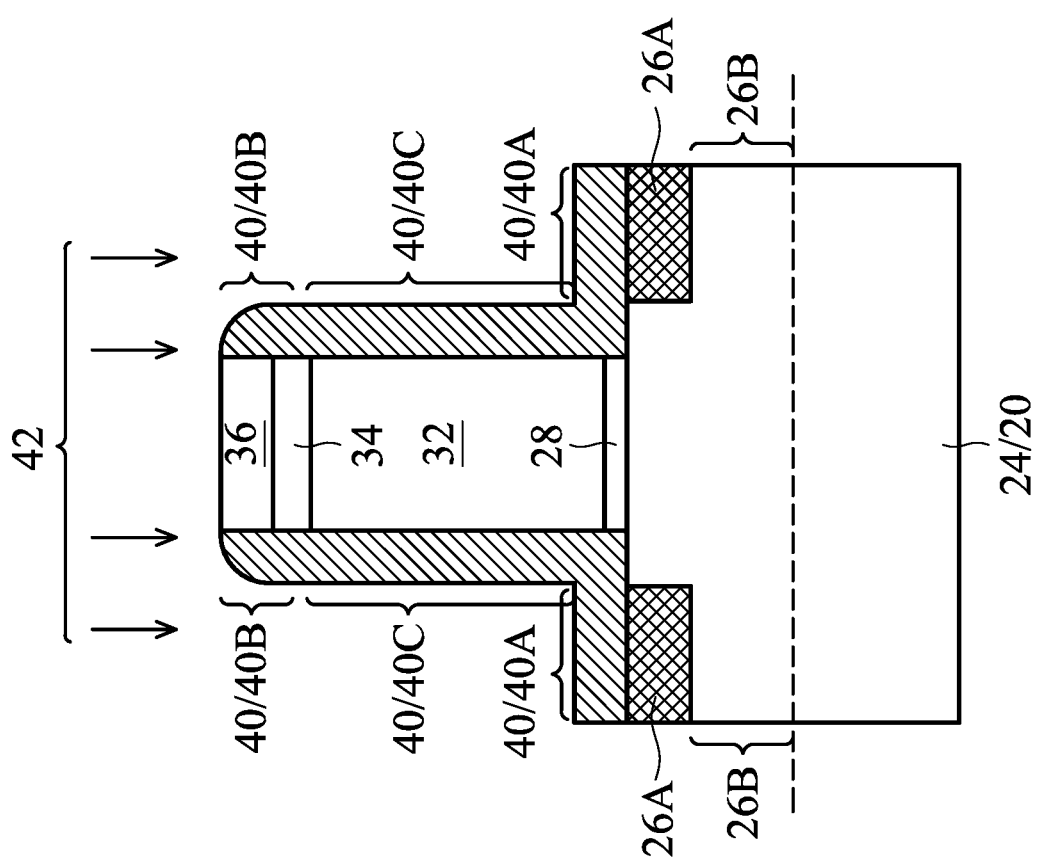

FIG. 4D illustrates a cross-sectional view of the structure shown in FIG. 4A, wherein the cross-sectional view is obtained from the plane containing line 4D-4D in FIG. 4A. As shown in FIG. 4D, the tilt implanted ions travel in a vertical plane that is parallel to the vertical sidewalls of the sidewall portions 40B and 40C of gate spacer layer 40. This ensures that in the implantation, at most the top portions 40B of gate spacer layer 40 are implanted, and the lower portions 40C are not implanted.

Figure 5B:
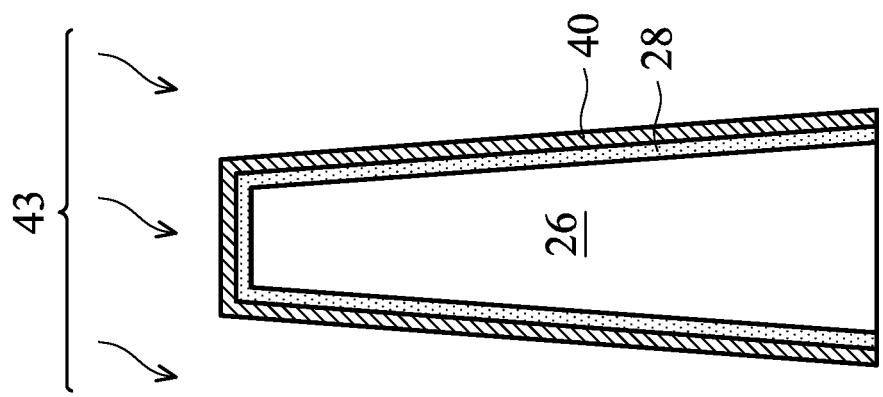
Figure 5A:
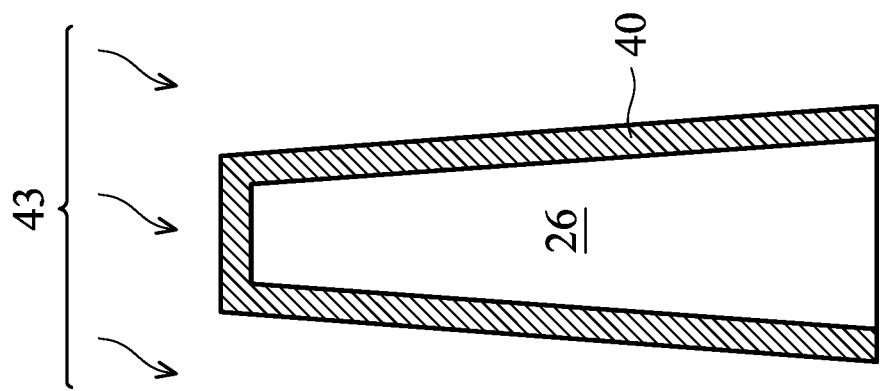

FIG. 5A illustrates a cross-sectional view of the structure after an anneal (represented as arrows 43) is performed, wherein the cross-sectional view is obtained from the same vertical plane containing line 4B-4B in FIG. 4A. The respective anneal step is shown as step 210 in the process flow shown in FIG. 12. In accordance with some embodiments of the present disclosure, the anneal 43 is performed through a thermal anneal such as Rapid Thermal Anneal (RTA) or a furnace anneal. The anneal temperature may be in the range between about 550° C. and about 1,300° C. The anneal duration may be in the range between about 1 millisecond to about tens of seconds or even longer. As a result of the anneal, the damage portions 26A (FIGS. 4B and 4C) to semiconductor fins 26 are at least repaired, and possibly recrystallized either fully or partially.

Referring back to FIGS. 4B and 4C, lower portions 26B of semiconductor fins 26 have a crystalline structure after the implantation. Accordingly, lower portions 26B act as the seed for the re-crystallization of the damaged/amorphized upper portions 26A. During the anneal, the re-crystallization may initially occur at the interface between amorphous regions 26A and the respective underlying crystalline regions 26B, and the interfaces may move up with the proceeding of the anneal. The crystalline portions 26B accordingly grow upwardly. The anneal may be performed until the interfaces move to the tops of semiconductor fins 26, so that all of semiconductor fins 26 are crystallized. Alternatively, the anneal may be finished when there is still a top portion not crystallized.

FIG. 5B illustrates the anneal for repairing damages in accordance with alternative embodiments. These embodiments are similar to the embodiments in FIG. 5A, except dummy oxide layer 28 has not been removed yet. The anneal process and the results are essentially the same as discussed for FIG. 5A, and hence are not repeated herein.

Figure 6:
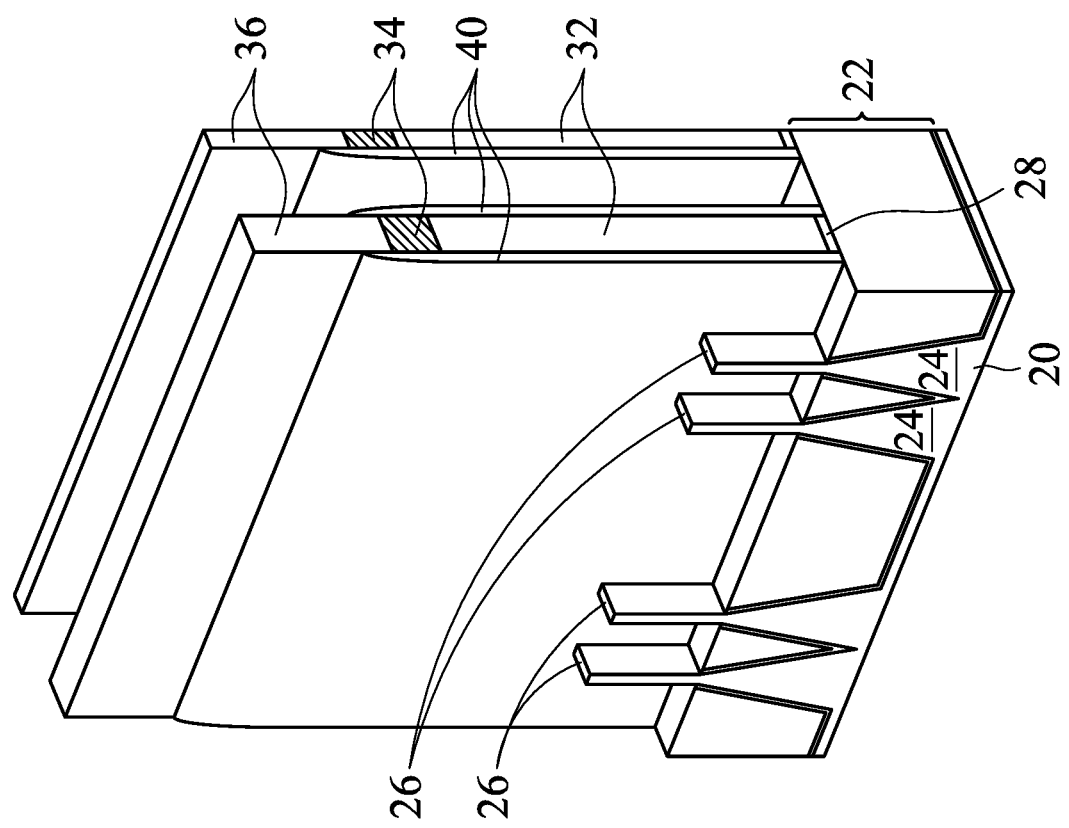

Referring to FIG. 6, an isotropic etching is performed to remove portions 40A and 40B (FIGS. 4A and 4D), which were implanted in the step shown in FIGS. 4A through 4D. The respective step is shown as step 212 in the process flow shown in FIG. 12. The etching may be a dry etching or a wet etching. The etchant is selected to attack the implanted portions 40A and 40B (FIGS. 4A and 4D) of gate spacer layer 40, and not to attack the un-implanted portions 40C (FIGS. 4A and 4D) of gate spacer layer 40. Accordingly, portions 40A and 40B of gate spacer layer 40 are removed, while portions 40C remain after the isotropic etching. The remaining portions of gate spacer layer 40 are referred to as gate spacers 40 hereinafter. If the portions of dummy oxide layer 28 (FIGS. 2 and 4C) on the portions of semiconductor fins 26 are not removed during the preceding steps, these portions of dummy oxide layer 28 will also be removed. As a result of the isotropic etching, semiconductor fins 26 are exposed again. In accordance with some embodiments of the present disclosure, gate spacer layer 40 comprises SiOCN. Accordingly, if wet etching is used, the etching solution may include phosphoric acid. If dry etching is used, the etching gas may include $CF_4$, oxygen, etc.

The thermal anneal as shown in FIGS. 5A and 5B advantageously repair the damage on the top portions 26A (FIGS. 4B and 4C). The damaged/amorphous portions 26A of semiconductor fins 26 are prone to the etching during the isotropic etching of gate spacer layer 40. Accordingly, if the damaged portions 26A are not repaired, the damaged top portions 26A are etched either fully or partially, resulting in fin loss. The fin loss causes the degradation of the resulting FinFETs. Advantageously, by performing the anneal to repair the damaged portions, the undesirable fin loss is avoided.

Figure 7:
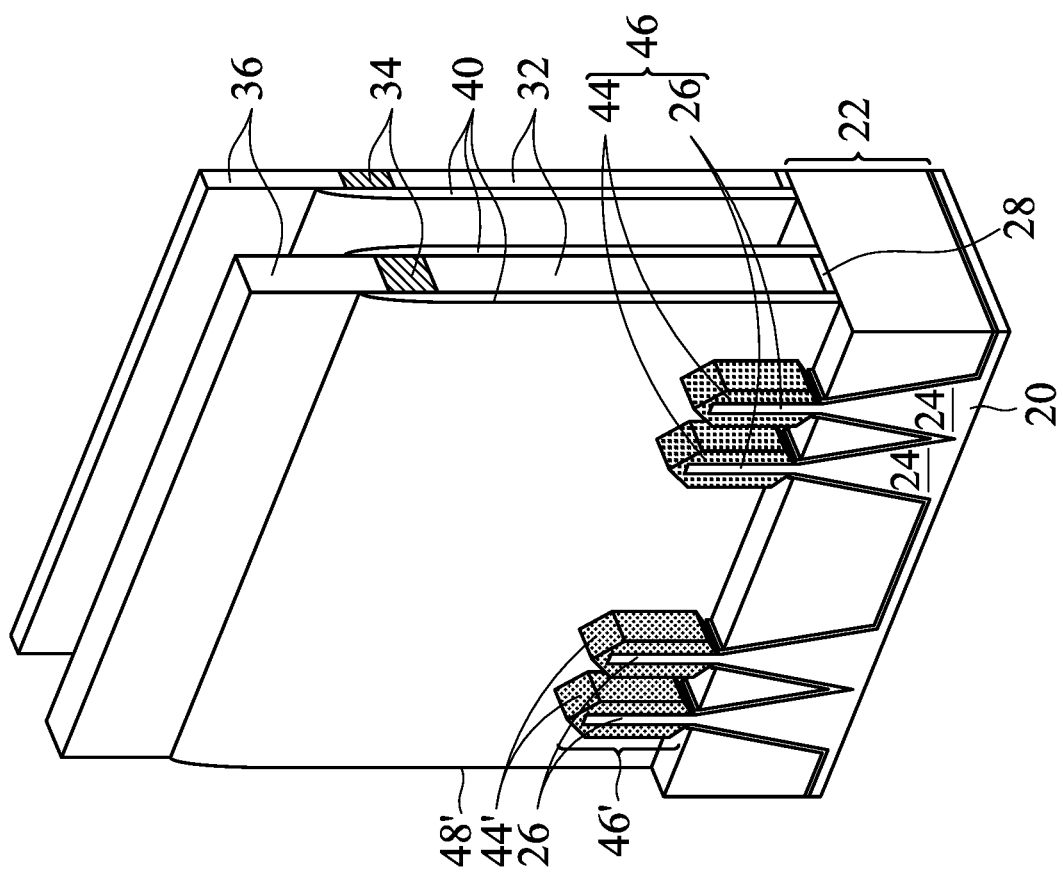

FIG. 7 illustrates the epitaxy for growing epitaxy regions 44 and 44' on the respective semiconductor fins 26. The respective step is shown as step 214 in the process flow shown in FIG. 12. Epitaxy regions 44 and the respective underlying semiconductor fins 26 in combination form the source and drain regions (referred to as source/drain regions hereinafter) 46. Epitaxy regions 44' and the respective underlying semiconductor fins 26 in combination form source/drain regions 46'. In accordance with some exemplary embodiments, epitaxy regions 44 include silicon phosphorous (SiP) or phosphorous-doped silicon carbon (SiCP), and the resulting FinFET is an n-type FinFET. Epitaxy regions 44' may include SiGe and a p-type impurity such as boron or indium, which may be in-situ doped during the epitaxy, and the resulting FinFET is a p-type FinFET. Since epitaxy regions 44 of the n-type FinFET is different from epitaxy regions 44' of the p-type FinFET, the p-type and n-type FinFETs need to be formed separately.

Figure 8:
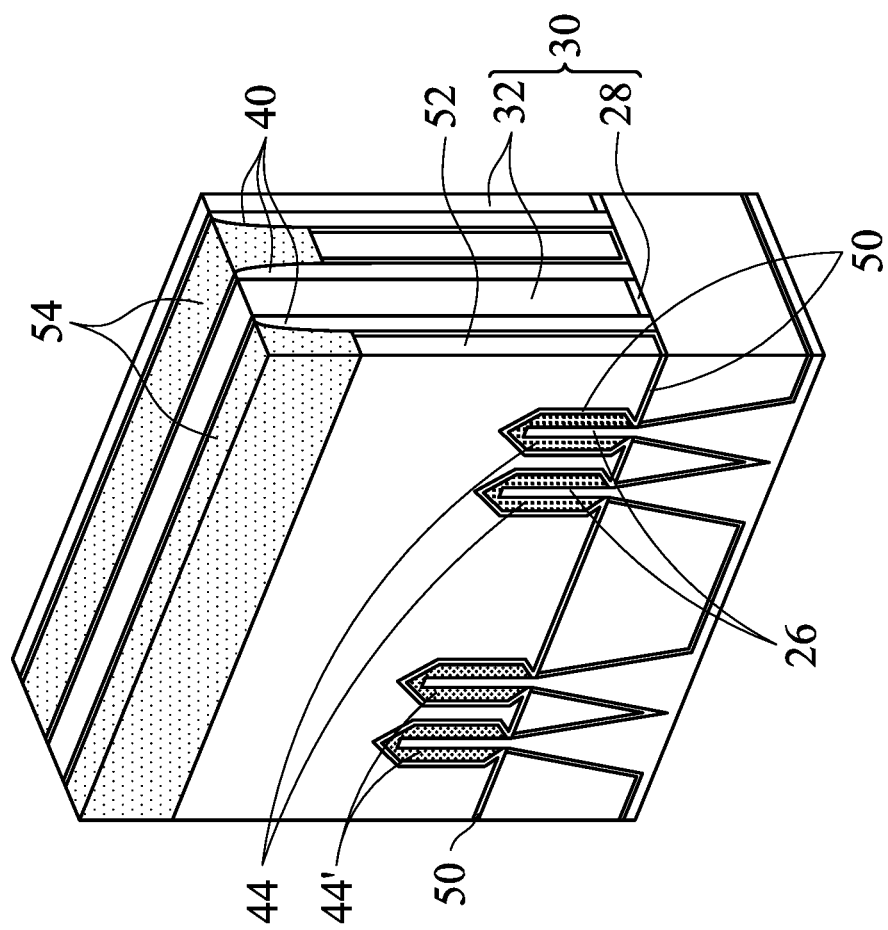

Next, as shown in FIG. 8, etch stop layer 50 is formed to conformally cover the structure shown in FIG. 7. Inter-Layer Dielectric (ILD) 52 is then formed over etch stop layer 50. The respective step is shown as step 216 in the process flow shown in FIG. 12. A CMP is then performed to level the top surfaces of ILD 52 and gate spacers 40 with each other. The CMP may be performed using dummy gate electrode 32 as a CMP stop layer, or alternatively, mask layer 34 or 36 (FIG. 7) may be used as the CMP stop layer. ILD 52 may then be recessed, and mask layer 54 is filled into the recess, followed by another CMP process, so that the top surfaces of mask layer 54 are coplanar with the top ends of gate spacers 40 and the remaining dummy gate electrode 32.

Figure 9:
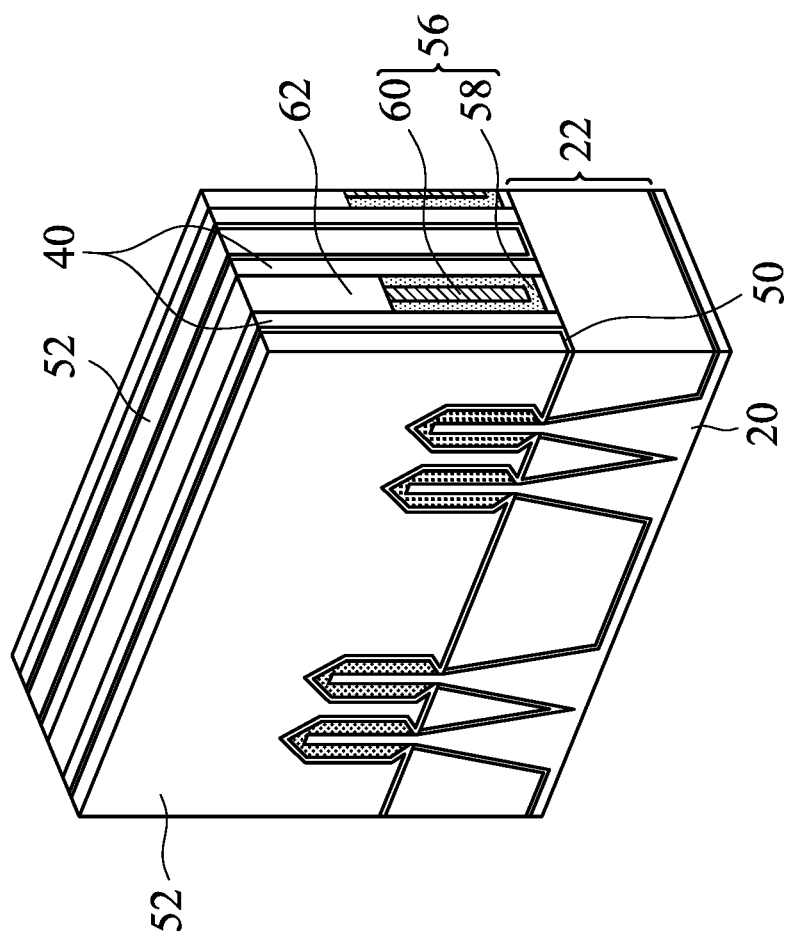

FIG. 9 illustrates the formation of replacement gate 56, which includes replacement gate dielectric 58 and replacement gate electrode 60. The respective step is shown as step 218 in the process flow shown in FIG. 12. The formation of replacement gate 56 includes performing an etching step to remove the dummy gate stack 30 as shown in FIG. 8, and forming replacement gate 56 in the recess left by the removed dummy gate stack 30. Gate dielectric 58 may include an interfacial oxide layer (such as a $SiO_2$ layer), and a high-k dielectric layer over the interfacial oxide layer. In accordance with some embodiments of the present disclosure, the high-k dielectric has a k value greater than about 7.0, and may include a metal oxide or a silicate of Hf, Al, Zr, La, or the like. Replacement gate electrode 60 may include a metal-containing material such as TiN, TaN, TaC, Co, Ru, Al, Cu, W, combinations thereof, or multi-layers thereof.

A CMP is performed to remove the excess portions of gate dielectric 58 and gate electrode 60 over gate spacers 40. Replacement gate 56 may be etched back, followed by filling dielectric material 62 in the recess formed by the etch-back. A CMP is then performed to planarize the top surfaces of dielectric material 62, gate spacers 40, and ILD 52. The CMP may be performed until the mask 54 as shown in FIG. 8 has been removed.

Figure 10:
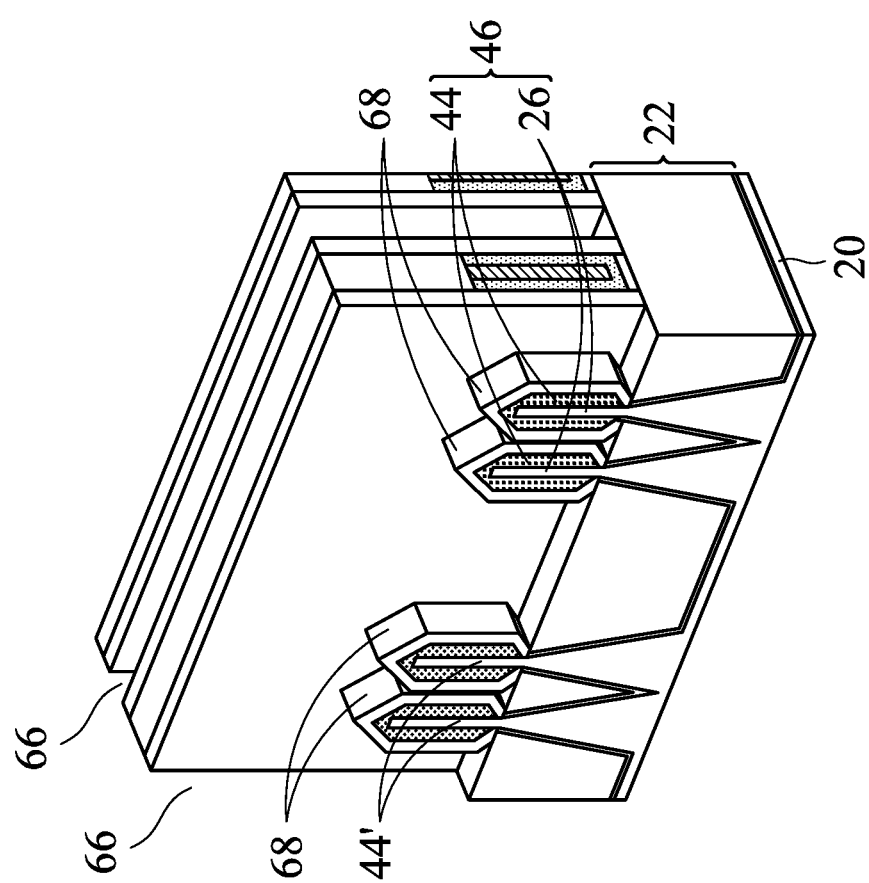
Figure 11:
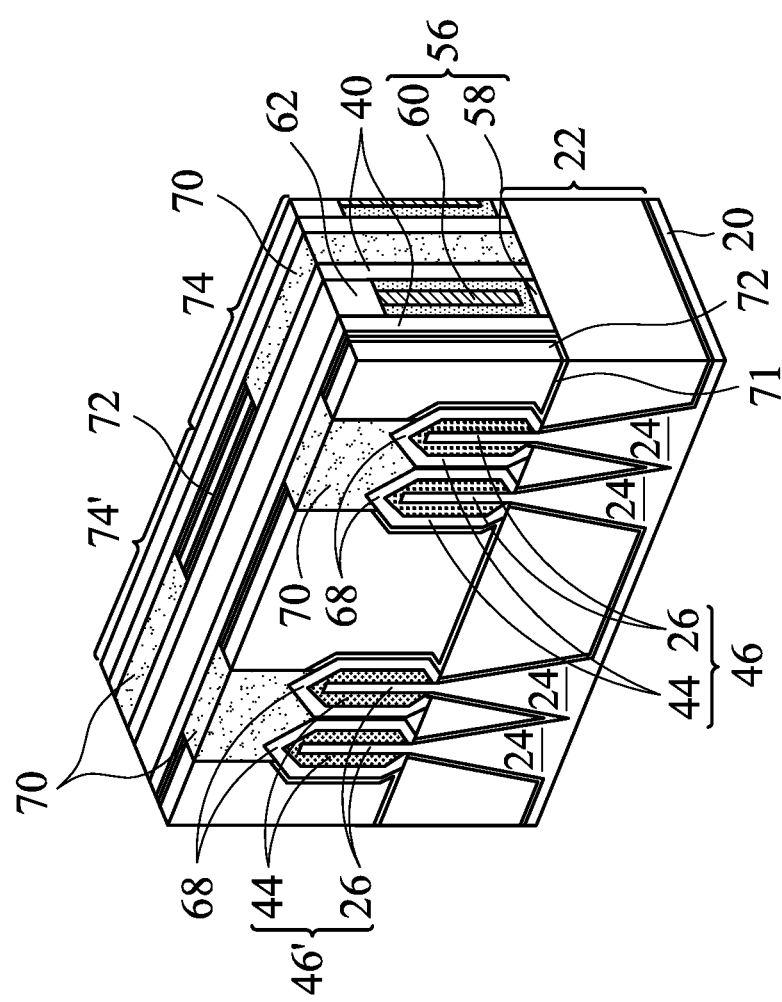
Figure 12:
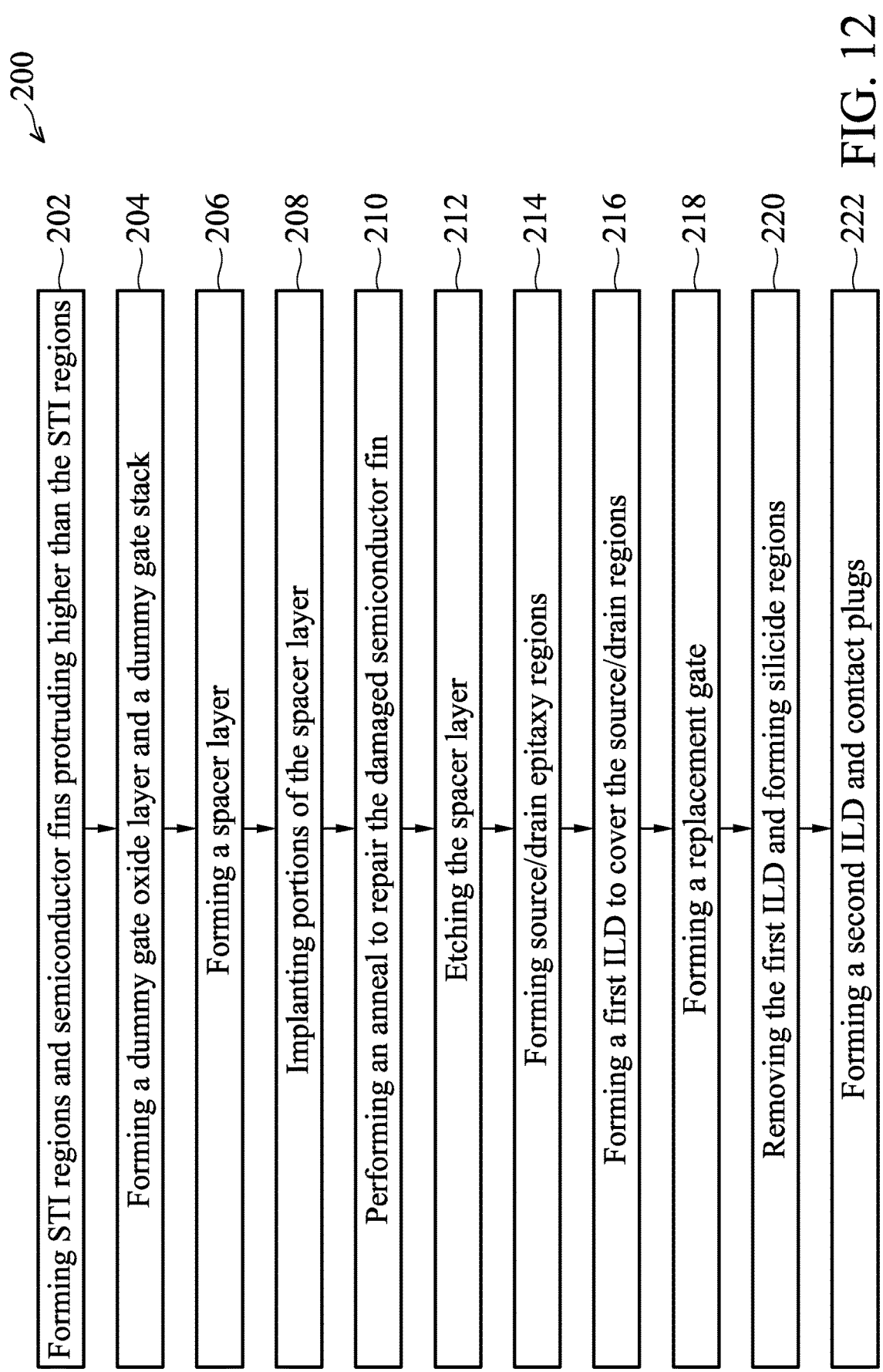
FIG. 12 illustrates a process flow for forming a FinFET in accordance with some embodiments.

FIGS. 10 and 11 illustrate the formation of source/drain silicide regions and contact plugs. It is appreciated that the embodiments shown in FIGS. 10 and 11 are exemplary, and different methods may be used. ILD 52 in FIG. 9 is first removed, forming recesses 66 as shown in FIG. 10. CESL layer 50 (FIG. 9) is thus exposed. The respective step is shown as step 220 in the process flow shown in FIG. 12. CESL layer 50 may be used as an etch stop layer for etching ILD 52. CESL layer 50 is then etched, exposing epitaxy regions 44 and 44'. Next, silicide regions 68 are formed by siliciding the surface portions of epitaxy regions 44 and 44', wherein the siliciding includes depositing a conformal metal layer (such as titanium, cobalt, or like, not shown), performing an anneal to react the metal layer with epitaxy regions 44 and 44', and remove the unreacted portions of the metal layer. The respective step is also shown as step 220 in the process flow shown in FIG. 12.

FIG. 11 illustrates the formation of contact plugs 70 and ILD 72. The respective step is shown as step 222 in the process flow shown in FIG. 12. In accordance with some embodiments of the present disclosure, etch stop layer 71 is formed, and then ILD 72 is formed to fill recesses 66, followed by a CMP to planarize ILD 72. Openings (filled by contact plugs 70) are then formed to expose at least some portions source/drain silicide regions 68. The openings are then filled with a metallic material such as tungsten. Another CMP process is performed to remove the excess metallic material, leaving contact plugs 70. N-type FinFET 74 and p-type FinFET 74' are thus formed. In subsequent processes, gate contact plugs (not shown) are formed to electrically connect to replacement gate electrode 60.

The embodiments of the present disclosure have some advantageous features. In order to form conformal gate spacers on the sidewalls of a gate stack, some portions of the blanket gate spacer layer on semiconductor fins need to be removed without removing the desired portions, which form the gate spacers. Accordingly, an implantation is performed to alter the property of the portions of the gate spacer layer on the semiconductor fins. The implantation, however, causes the top portions of the semiconductor fins to be damaged, and the damaged portions may be adversely etched in the subsequent etching of the gate spacer layer. In accordance with some embodiments of the present disclosure, an anneal is performed to repair the damage and re-crystallize the semiconductor fins. The fin loss caused by the damage is thus avoided.

In accordance with some embodiments of the present disclosure, a method includes forming a dummy gate stack on a top surface and a sidewall of a middle portion of a semiconductor fin, and forming a spacer layer. The spacer layer includes a first portion on a sidewall of the dummy gate stack, and a second portion on a top surface and a sidewall of a portion of the semiconductor fin. The method further includes performing an implantation on the second portion of the spacer layer. After the implantation, an anneal is performed. After the anneal, the second portion of the spacer layer is etched, wherein the first portion of the spacer layer remains after the etching. A source/drain region is formed on a side of the semiconductor fin.

In accordance with some embodiments of the present disclosure, a method includes forming a dummy gate stack on a top surface and a sidewall of a middle portion of a semiconductor fin, and forming a spacer layer, which includes a first portion on a sidewall of the dummy gate stack, and a second portion on a top surface and a sidewall of the semiconductor fin. The method further includes amorphizing a top portion of the semiconductor fin, wherein the spacer layer covers the amorphized top portion of the semiconductor fin, re-crystallizing the amorphized top portion, etching the second portion of the spacer layer, wherein the first portion of the spacer layer remains after the etching, and forming a source/drain region on a side of the semiconductor fin.

In accordance with some embodiments of the present disclosure, a method includes forming a gate stack over a semiconductor fin. The gate stack covers a middle portion of the semiconductor fin, and a portion of the semiconductor fin is exposed. A blanket dielectric layer is formed on the gate stack and the semiconductor fin. The blanket dielectric layer includes fin portions on a top surface and sidewalls of the portion of the semiconductor fin, and a sidewall portion on a sidewall of the gate stack. The fin portions are implanted with a dopant. The respective wafer is annealed. An isotropic etch is performed to remove the fin portions of the blanket dielectric layer, with the sidewall portion of the blanket dielectric layer remaining after the isotropic etch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a spacer layer comprising:
      a top portion on a topmost surface of a gate stack; and
      a sidewall portion on a sidewall of the gate stack, the sidewall portion being a continuous material with the top portion;
   implanting dopants into the top portion of the spacer layer, wherein after the implanting the top portion of the spacer layer has a higher concentration of the dopants than the sidewall portion of the spacer layer; and
   after the implanting, performing an isotropic etch process on the spacer layer using an etching chemical, with both of the top portion and the sidewall portion of the spacer layer being exposed to the etching chemical, wherein the top portion is removed by the etching chemical, and the sidewall portion of the spacer layer remains after the isotropic etch process.

2. The method of claim 1 further comprising:
   before forming the spacer layer, forming a fin over a semiconductor substrate; and
   forming the gate stack over the fin.

3. The method of claim 2, wherein implanting the dopants comprises implanting the dopants into the fin.

4. The method of claim 3, wherein the implanting the dopants comprises implanting the dopants at two tilted angles along a vertical plane.

5. The method of claim 4, wherein the dopants comprise one or more of nitrogen ions, boron ions, and fluorine ions.

6. The method of claim 3, wherein the implanting the dopants into the fin results in an upper portion of the fin changing from crystalline to amorphous.

7. The method of claim 6 further comprising, before performing the isotropic etch, annealing the fin.

8. The method of claim 7, wherein the annealing the fin results in at least a portion of the upper portion of the fin changing from amorphous to crystalline.

9. A method comprising:
   forming a fin in a semiconductor substrate;
   forming a dummy gate structure over the fin, the dummy gate structure comprising a mask layer;
   depositing a gate spacer layer over an upper surface of the fin, sidewalls of the fin, an upper surface of the dummy gate structure, and sidewalls of the dummy gate structure;
   implanting the gate spacer layer with dopants, the dopants extending into an entirety of a thickness of the gate spacer layer over the upper surface of the fin, over the sidewalls of the fin, and over the upper surface of the dummy gate structure;
   etching to remove the gate spacer layer over the upper surface of the fin, over the sidewalls of the fin, and over the upper surface of the dummy gate structure, wherein after the etching a remaining portion of the gate spacer layer remains over the sidewalls of the dummy gate structure; and
   removing the dummy gate structure.

10. The method of claim 9, wherein the implanting the gate spacer layer with dopants further comprises amorphizing a portion of the fin.

11. The method of claim 9 further comprising:
    after the etching, epitaxially growing a source/drain region on the sidewalls of the fin; and
    forming a replacement gate structure.

12. The method of claim 9, wherein the implanting the gate spacer layer with the dopants comprises a first tilted implantation at a first angle and a second tilted implantation at a second angle.

13. The method of claim 12, wherein the first angle is a mirror of the second angle against a vertical plane.

14. The method of claim 12, wherein the first angle and the second angle are parallel to an inner sidewall of the gate spacer layer, the inner sidewall being in contact with the dummy gate structure.

15. The method of claim 9, wherein forming the dummy gate structure comprises:
    depositing a dummy gate dielectric layer over the fin;
    depositing a dummy gate electrode over the dummy gate dielectric layer;
    depositing the mask layer; and
    patterning the dummy gate electrode.

16. The method of claim 15, wherein the dummy gate dielectric layer interposes the fin and the gate spacer layer.

17. A method comprising:
    forming a dummy gate structure over a substrate, the dummy gate structure having an upper portion and a lower portion, the lower portion being more proximal to the substrate than the upper portion, the dummy gate structure interposing a first semiconductor region and a second semiconductor region, each of the first semiconductor region and the second semiconductor region comprising a top portion and a bottom portion, the bottom portion being more proximal to the substrate than the top portion;
    depositing a gate spacer layer over the dummy gate structure, the first semiconductor region, and the second semiconductor region, the gate spacer layer comprising a topmost portion above the dummy gate structure and a sidewall portion along sidewalls of the dummy gate structure;
    implanting first dopants into the gate spacer layer at a first angle and second dopants into the gate spacer layer at a second angle, the first angle and the second angle forming a vertical plane, the vertical plane being parallel to a sidewall of the dummy gate structure, the topmost portion and the sidewall portion resulting in different etch selectivities; and
    after implanting the first dopants, etching the topmost portion of the gate spacer layer.

18. The method of claim 17, wherein the first dopants and the second dopants reach the upper portion of the dummy gate structure and the top portion of the first semiconductor region and the top portion of the second semiconductor region, and further wherein the lower portion of the dummy gate structure and the bottom portion of the first semiconductor region and the second semiconductor region remain free of the first dopants and the second dopants.

19. The method of claim 18, wherein the first dopants and the second dopants amorphize the top portion of the first semiconductor region and the second semiconductor region.

20. The method of claim 19 further comprising, after implanting the first dopants, annealing to crystallize the first semiconductor region and the second semiconductor region.

\* \* \* \* \*